United States Patent
Lian et al.

(10) Patent No.: US 11,847,398 B2
(45) Date of Patent: Dec. 19, 2023

(54) AUTOMATIC GENERATION OF GROUND RULE VERIFICATION MACROS

(71) Applicant: INTERNATIONAL BUSINESS MACHINES CORPORATION, Armonk, NY (US)

(72) Inventors: Jingyu Lian, Albany, NY (US); Shruthi Venkateshan, Albany, NY (US); Tenko Yamashita, Albany, NY (US); Jinning Liu, Littleton, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 169 days.

(21) Appl. No.: 17/303,170

(22) Filed: May 21, 2021

(65) Prior Publication Data
US 2022/0374578 A1    Nov. 24, 2022

(51) Int. Cl.
*G06F 30/398*    (2020.01)
*G06F 30/392*    (2020.01)

(52) U.S. Cl.
CPC .......... *G06F 30/398* (2020.01); *G06F 30/392* (2020.01)

(58) Field of Classification Search
CPC .......... G06F 21/78; G06F 21/57; G06F 21/73; G06F 21/64; G06F 21/554; G06F 21/575; G06F 21/71; G06F 21/74; G06F 21/602; G06F 16/258; G06F 21/6227; G06F 1/163; G06F 3/00; G06F 30/367; G06F 30/392; G06F 16/43; G06F 16/953; G06F 21/445; G06F 30/398; G06F 12/1408; G06F 16/21; G06F 16/2343; G06F 16/252; G06F 21/606; G06F 21/72; G06F 21/85; G06F 2113/18; G06F 2119/08; G06F 2221/2103; G06F 30/20; G06F 30/3312; G06F 30/394; G06F 16/10; G06F 16/2308; G06F 16/2365; G06F 16/25; G06F 16/27; G06F 16/28; G06F 16/3344; G06F 16/9024; G06F 16/9537; G06F 16/9554; G06F 21/608; G06F 2111/02; G06F 3/013; G06F 3/014; G06F 3/017; G06F 30/00; G06F 30/33; G06F 30/30; G06F 2119/04; G06F 2119/10; G06F 30/39; G06F 16/90335;
(Continued)

(56) References Cited

U.S. PATENT DOCUMENTS 6,418,551 B1    7/2002    McKay et al.
8,539,421 B2    9/2013    Agarwal et al.
(Continued)

OTHER PUBLICATIONS

Anonymous, "Manufacturability and Yield Improvement with Placement & Routing Optimization", IPCOM000232255D, Oct. 29, 2013.

*Primary Examiner* — Binh C Tat
(74) *Attorney, Agent, or Firm* — Griffiths & Seaton PLLC

(57) ABSTRACT

Ground rule verification ("GRV") design layouts may be automatically generated based on one or more design macros. The GRV design layout may be tested based on the one or more design macros by violating one or more ground rules using one or more GRV ranges. The testing may include electrical testing of the one or more GRV design layouts based on the one or more design macros. The one or more ground rules may be automatically selected and approved the based upon a degree of violation acceptability.

20 Claims, 6 Drawing Sheets

(58) Field of Classification Search
CPC .............. G06F 2111/04; G06F 2111/20; G06F 2119/12; G06F 30/27; G06F 30/31; G06F 30/32; G06F 30/3953; G06F 18/2413; G06F 18/2185; G06F 2119/06; G06F 16/2336; G06F 18/2415; H01L 2224/12105; H01L 24/20; H01L 2924/15311; H01L 2224/73267; H01L 23/49838; H01L 23/5386; H01L 23/49816; H01L 2224/48227; H01L 24/13; H01L 2224/49111; H01L 2224/49176; G03F 1/84
USPC ................................................ 716/110–116
See application file for complete search history.

(56) References Cited

U.S. PATENT DOCUMENTS

| | | | |
|---|---|---|---|
| 9,690,898 B2 | 6/2017 | Graur et al. | |
| 10,042,973 B2 | 8/2018 | Graur et al. | |
| 10,585,346 B2 * | 3/2020 | Lin et al. | |
| 11,042,806 B1 * | 6/2021 | Jiang | G06F 30/398 |
| 2014/0282329 A1 * | 9/2014 | Aggarwal | G06F 30/398 |
| | | | 716/112 |
| 2015/0324510 A1 * | 11/2015 | Aggarwal | G06F 30/398 |
| | | | 716/112 |
| 2016/0378902 A1 * | 12/2016 | Graur | G06F 30/394 |
| | | | 716/52 |
| 2018/0107781 A1 | 4/2018 | Berkens et al. | |
| 2018/0121594 A1 * | 5/2018 | Studders | G06F 30/398 |

* cited by examiner

AUTOMATIC GENERATION OF GROUND RULE VERIFICATION MACROS

BACKGROUND

The present invention relates in general to computing systems, and more particularly, to various embodiments for automatic generation of ground rule verification macros in a computing system using a computing processor.

SUMMARY

According to an embodiment of the present invention, a method for automatic generation of ground rule verification macros (e.g., design macros) of an integrated circuit in a computing environment, by one or more processors, in a computing system. A ground rule verification ("GRV") design layout(s) may be automatically generated based on one or more design macros. The GRV design layout may be tested based on the one or more design macros by violating one or more ground rules using one or more GRV ranges. The testing may include electrical testing of the one or more GRV design layouts based on the one or more design macros. The one or more ground rules may be automatically selected and approved the based upon a degree of violation acceptability.

In an additional embodiment, the ground rules being violated may be within the degree of violation acceptability. Ground rules and GRV ranges may be learned and/or defined according to one or more selected parameters. Also, an initial design layout of the integrated circuit may be selected based on the target ground rules and the GRV ranges. The design macros may be learned and defined for automatically generating the GRV design layouts. The ground rules may be intentionally violated and compared to the target ground rule to determine the degree of violation and/or the degree of violation acceptability.

In another embodiment, the ground rules may be learned and defined to test the GRV design layouts. The testing may include electrical testing of the one or more GRV design layouts based on the one or more design macros. The results of testing the GRV design layout based on the one or more design macros may be analyzed and generated. The ground rules may be corrected or waived based upon the degree of violation acceptability for approving the one or more GRV design layouts for manufacturing.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

Thus, in addition to the foregoing exemplary method embodiments, other exemplary system and computer product embodiments for automated evaluation of robustness of machine learning models under adaptive whitebox adversarial operation are provided.

DETAILED DESCRIPTION OF THE DRAWINGS

Figure 1:
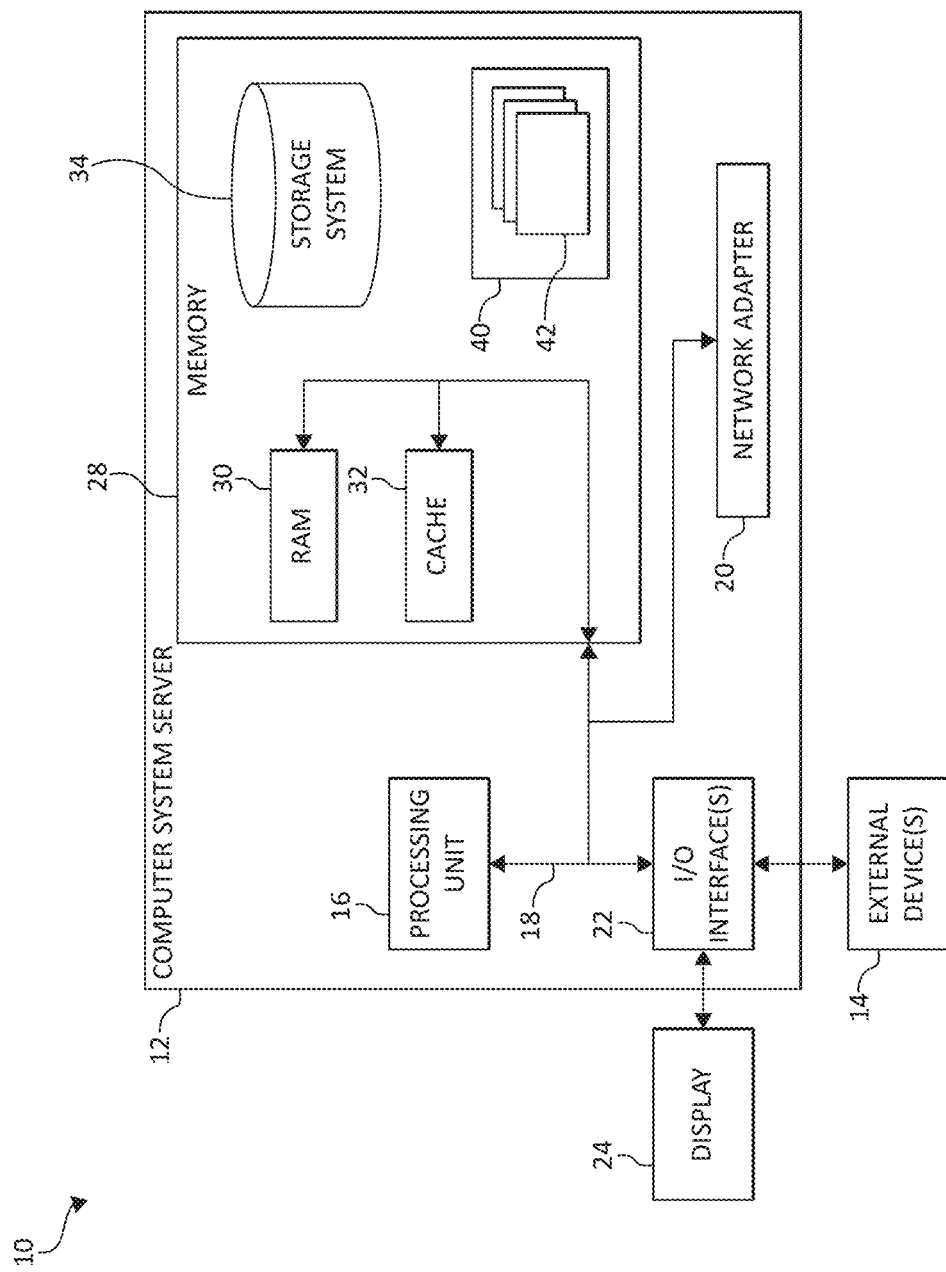
FIG. 1 is a block diagram depicting an exemplary cloud computing node according to an embodiment of the present invention.

The present invention relates generally to the field of electrical, electronic, and computer arts, and more specifically, to semiconductor Electronic Design Automation (EDA) and the like.

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". Moreover, the IC chip may include a large number of electronic components that are fabricated by layering several different materials on a silicon base or wafer. The design of an IC transforms a circuit description into a geometric description which is known as a layout. The process of converting the functional specifications of an electronic circuit into a layout is called the physical design. The objective of the physical design is to determine an optimal arrangement of devices in a plane or in a three-dimensional space, and an efficient interconnection or routing scheme between the devices to obtain the desired functionality.

The software tools used for designing ICs produce, manipulate, or otherwise work with the circuit layout and circuit components on very small scales. The designs produced and manipulated using these software tools are complex, often including hundreds of thousands of such components interconnected to form an intended electronic circuitry. A layout includes shapes that the designer selects and positions to achieve a design objective. The objective is to have the shape—the target shape—appear on the wafer as designed.

EDA involves the use of software tools for designing electronic systems such as, for example, the ICs and printed circuit boards. The EDA tools may rely on technical files with component macro relying on technical files. The component macro may include one or more macros. In one aspect, a macro defines a particular type, design structure/design hierarchy, entity, component, or element of an IC such as, for example, static random access memory, a memory management unit ("MMU"), and other standard logic circuitry. In other words, a design macro may be an entity, design structure, component, or element of an IC. In an additional aspect, macro may be a program that creates and analyzes a functional block of an integrated circuit. In this way, a macro may work on a file that includes the design for a particular function block of a section of a design. Thus, one macro can be operated on independent from of other macros.

One aspect of design is design rule checking or checks(s) ("DRC"). DRC is the area of electronic design automation that determines whether the physical layout of a particular chip layout satisfies a series of recommended parameters called design rules or "ground rules." Design rule checking is a major step during physical verification signoff on the design. Design rules may be predefined or learned (e.g., machine operations). Design rules may also be a series of parameters provided by semiconductor manufacturers that enable the designer to verify the correctness of a mask set. Design rules are specific to a particular semiconductor manufacturing process. A design rule set specifies certain geometric and connectivity restrictions to ensure sufficient margins to account for variability in semiconductor manufacturing processes, so as to ensure that the parts work correctly. For example, one design rule may be a width rule that specifies a minimum width of any shape (e.g., the minimum width of a threshold voltage (VT) shape used to define device performance) in the design. Another design rule may be a spacing rule that specifies a minimum distance between two adjacent shapes. The design rules may exist for each layer of a semiconductor manufacturing process. The main objective of DRC is to achieve a high overall yield and reliability for the design. If design rules are violated, the design may not be functional.

Moreover, the design rule (e.g., ground rules) are put in place to safeguard design process integrity while permitting efficient utilization of valuable design space. Achieving balance between the two aspects (e.g., integrity balanced with efficiency) often means ground rule values are defined or set at a point allowed by only the most aggressive design process capability. Additionally, ground rules may be defined based on one or more "process assumptions" before any IC (or wafer) data is available. As wafers are processed, it becomes of extreme importance and interest to verify these ground rule values actually represent a feasible process. Such verification requires a vehicle named Ground Rule Verification macros ("GRV").

A current challenge of GVR macro design is highly resource consuming due to 1) requirement to violate the target design rule to explore the process window, and 2) the requirement to pass critical design rules to ensure there is an electrical read out from the GVR macro design. Thus, a need exists for automatic generation of GVR macro design and testing while also determining a degree or level in which the ground rules may be violated but maintain consistent, reliable, and predictable results allowed for manufacturer approval.

Thus, as described herein, mechanisms of the illustrated embodiments provide for automatic generation of GVR macros (e.g., design macros) of an integrated circuit in a computing environment. Ground rule verification ("GRV") design layouts may be automatically generated based on one or more design macros. The GRV design layout(s) may be tested based on the design macros by violating one or more ground rules using one or more GVR ranges. The testing may include electrical testing of the GRV design layout(s) based on the one or more design macros. The ground rules may be automatically selected and approved based upon a degree of violation acceptability.

In an additional embodiment, mechanisms of the illustrated embodiments may automatically integrate DRC checking with the automatic generation of a GVR macro design. Combined, the automatic GVR macro design generation operation includes automatically generating one or more design macros based on given input specification (e.g., design macro specification), ground rules, and GRV ranges (e.g., GVR values). DRC errors may be detected based on any violation of the ground rules based on the variously applied GRV ranges (e.g., GVR values). Based on the ground rules, the violations may be allowed based on the applied GVR ranges. That is, although the testing violates the ground rules using the GVR ranges, the violations may be within a defined or learned range of allowability. This "zone of rule-violation allowability" may then be communicated or provided with the results of the testing. A determination operation may be executed to then decide whether to correct, fix, allow, or waive the DRC error(s) based on the "zone of rule-violation allowability." In one aspect, the "zone of rule-violation allowability" may be defined, determined, and/or learned such as, for example, from machine learning.

In an additional aspect, a GRV macro design specification may be generated. A set of GRV macro design layouts may be automatically generated (based on the GRV macro design specification(s)) for electrical testing. One or more design rule(s) checking may be selectively applied on the generated GRV macro design layouts. The DRC checking results may be reported and stored/saved in a database such as, for example, a design macro-submission database.

In this way, the mechanisms of the illustrated embodiments may automatically generate a macro design layout based on input macro specifications to ensure a timely and accurate GRV macro design layout. DRC checking may automatically be selected to support and test the GVR macro design, which in turn improves the efficiency in testing.

In general, as used herein, "optimize" may refer to and/or defined as "maximize," "minimize," "best," or attain one or more specific targets, objectives, goals, or intentions. Optimize may also refer to maximizing a benefit to a user (e.g., maximize a trained machine learning pipeline/model benefit). Optimize may also refer to making the most effective or functional use of a situation, opportunity, or resource.

Additionally, optimizing need not refer to a best solution or result but may refer to a solution or result that "is good enough" for a particular application, for example. In some implementations, an objective is to suggest a "best" combination of preprocessing operations ("preprocessors") and/or machine learning models/machine learning pipelines, but there may be a variety of factors that may result in alternate suggestion of a combination of preprocessing operations ("preprocessors") and/or machine learning models yielding better results. Herein, the term "optimize" may refer to such results based on minima (or maxima, depending on what parameters are considered in the optimization problem). In an additional aspect, the terms "optimize" and/or "optimizing" may refer to an operation performed in order to achieve an improved result such as reduced execution costs or increased resource utilization, whether or not the optimum result is actually achieved. Similarly, the term "optimize" may refer to a component for performing such an improvement operation, and the term "optimized" may be used to describe the result of such an improvement operation.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
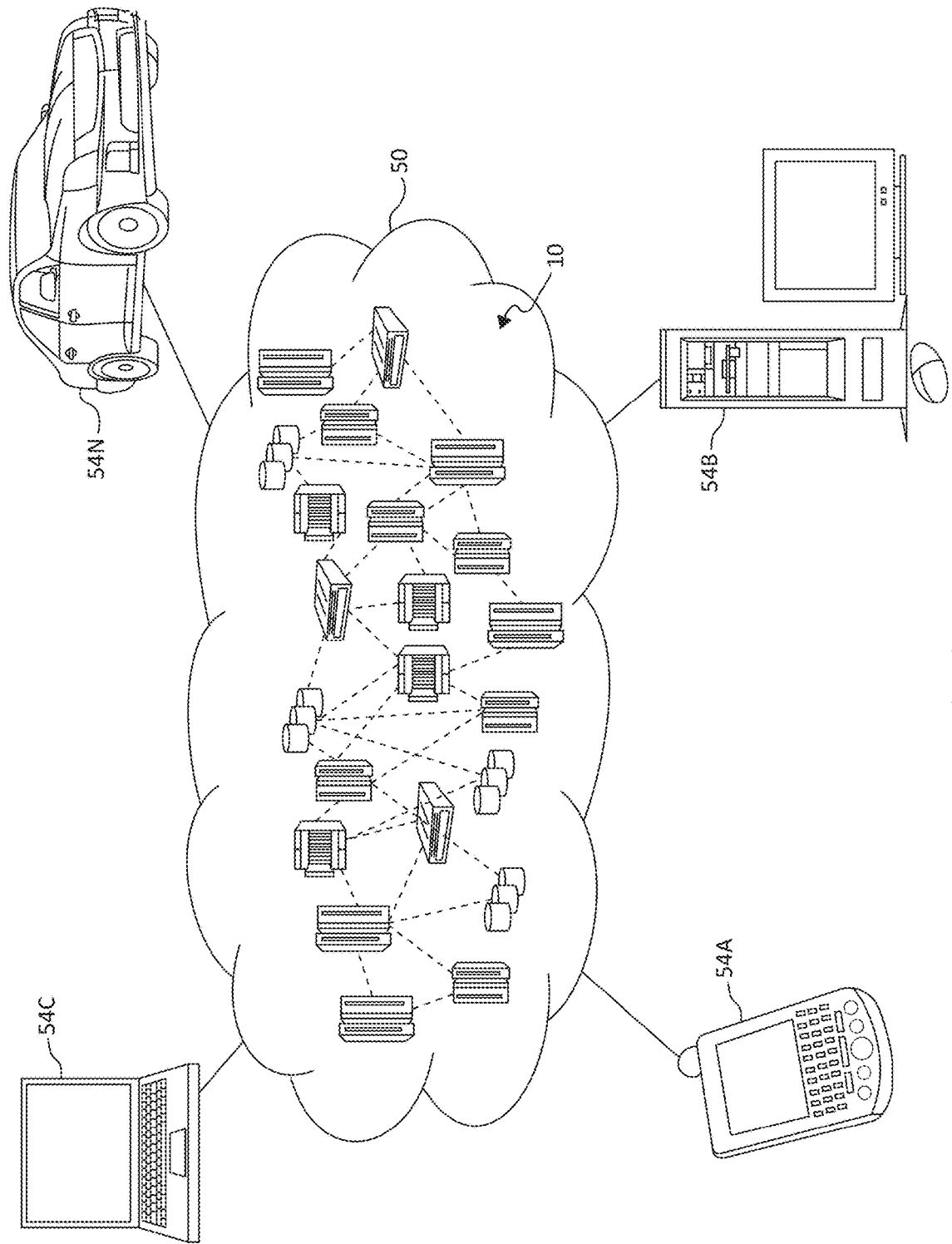
FIG. 2 depicts a cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
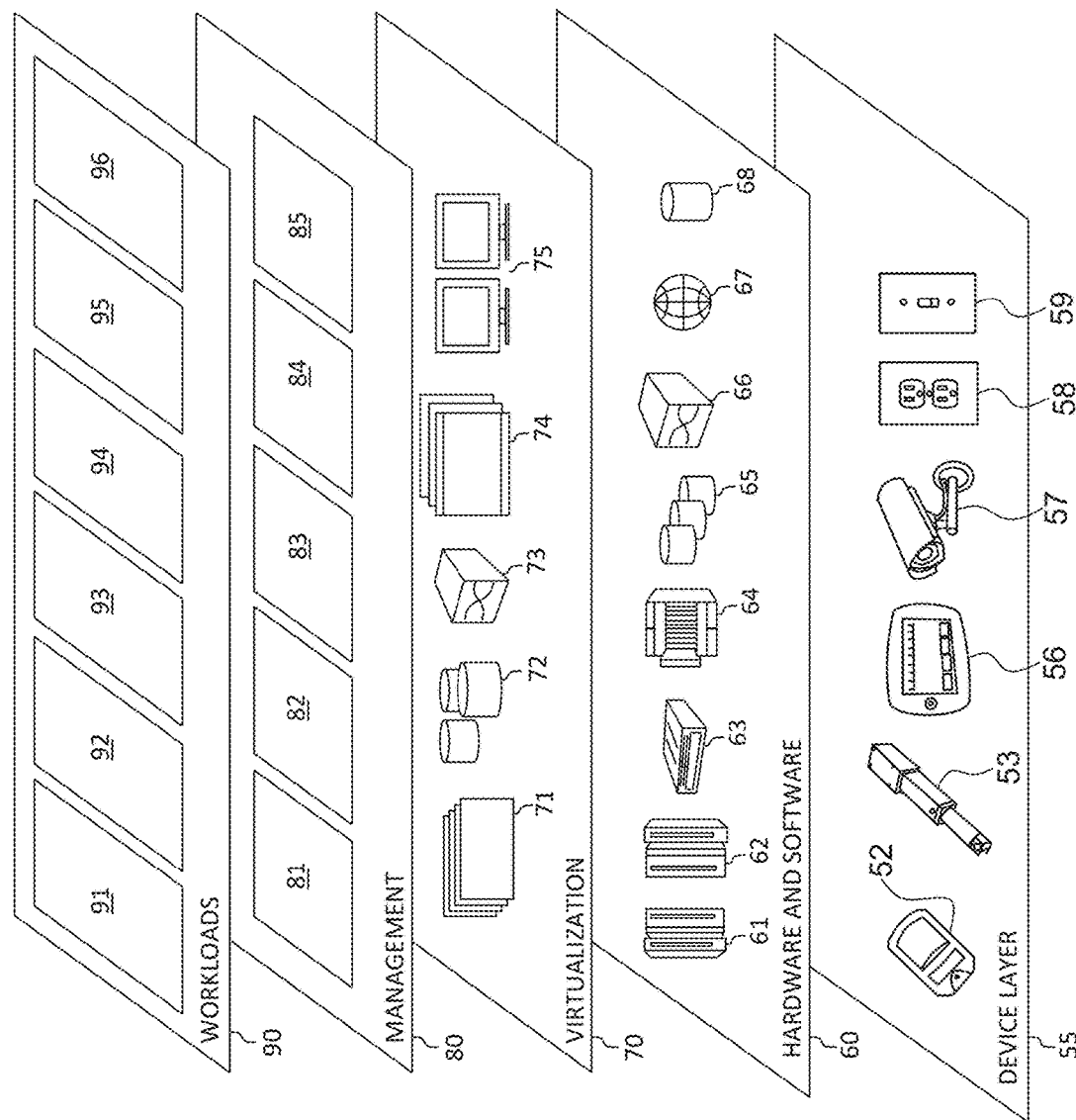
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for automatic generation of ground rule verification macros in a computing environment (e.g., in a neural network architecture). In addition, workloads and functions 96 for automatic generation of ground rule verification macros in a computing environment may include such operations as analytics, deep learning, and as will be further described, user and device management functions. One of ordinary skill in the art will appreciate that the workloads and functions 96 for automatic generation of ground rule verification macros in a computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

As previously stated, the present invention provides novel solutions for automatic generation of ground rule verification macros for an integrated circuit in a computing environment by one or more processors in a computing system. Ground rule verification ("GRV") design layouts may be automatically generated based on one or more design macros. The GRV design layout may be tested based on the one or more design macros by violating one or more ground rules using one or more GRV ranges. The testing may include electrical testing of the one or more GRV design layouts based on the one or more design macros. The one or more ground rules may be automatically selected and approved the based upon a degree of violation acceptability.

Figure 4:
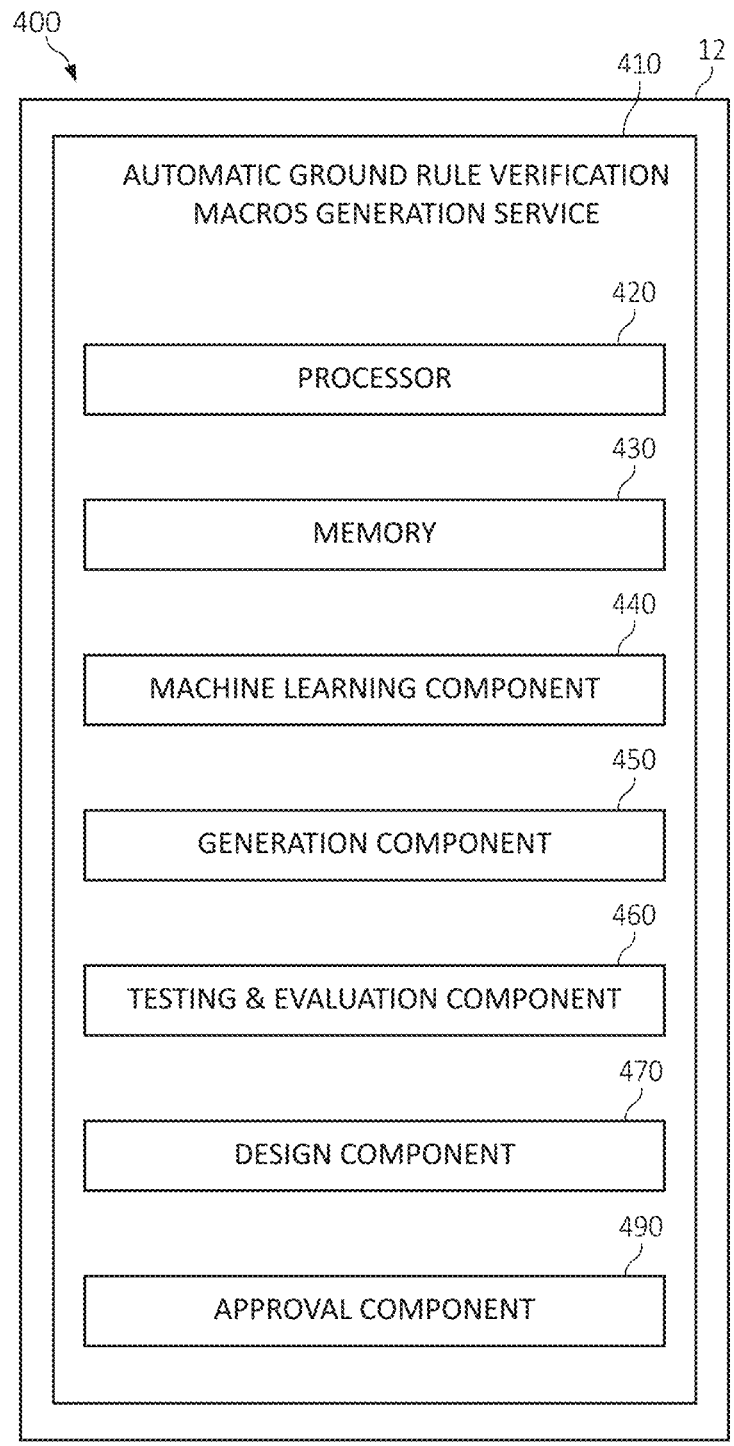
FIG. 4 is an additional block diagram depicting an exemplary functional relationship between various aspects of the present invention.

Turning now to FIG. 4, a block diagram depicting exemplary functional components of system 400 for automatic generation of ground rule verification macros in a computing environment according to various mechanisms of the illustrated embodiments is shown. In one aspect, one or more of the components, modules, services, applications, and/or functions described in FIGS. 1-3 may be used in FIG. 4. As will be seen, many of the functional blocks may also be considered "modules" or "components" of functionality, in the same descriptive sense as has been previously described in FIGS. 1-3.

An automatic ground rule verification macro design generation service 410 is shown, incorporating processing unit 420 ("processor") to perform various computational, data processing and other functionality in accordance with various aspects of the present invention. In one aspect, the processor 420 and memory 430 may be internal and/or external to the automatic ground rule verification macro design generation service 410, and internal and/or external to the computing system/server 12. The automatic ground rule verification macro design generation service 410 may be included and/or external to the computer system/server 12, as described in FIG. 1. The processing unit 420 may be in communication with the memory 430. The automatic ground rule verification macro design generation service 410 may include a machine learning component 440, a generation component 450, a testing and evaluation component 460, a design component 470, and an approval component 480.

In one aspect, the system 400 may provide virtualized computing services (i.e., virtualized computing, virtualized storage, virtualized networking, etc.). More specifically, the system 400 may provide virtualized computing, virtualized storage, virtualized networking and other virtualized services that are executing on a hardware substrate.

The machine learning component 440, in association with the generation component 450, a testing and evaluation component 460, a design component 470, and an approval component 480 may automatically generate one or more ground rule verification ("GRV") design layouts based on one or more design macros, test the GRV design layout based on the one or more design macros by violating one or more ground rules using one or more GRV range, and automatically select and approve the one or more ground rules based upon a degree of violation acceptability.

In one aspect, the testing and evaluation component 460 may determine one or more ground rules that are being violated are within the degree of violation acceptability. In one aspect, the GRV range may be a range of percentages, values, patterns, dimensions, structure designs, and/or configurations for intentionally violating or breaking a ground rule. The degree of violation acceptability may be a range of acceptable ground rule violations (e.g., acceptable range of ground rule violation window).

The design component 470, which may in association with the machine learning component 440 and the generation component 450, may be define one or more target ground rules, define the one or more GRV ranges according to one or more selected parameters, and select an initial design layout of the integrated circuit based on the one or more target ground rules and the one or more GRV ranges.

The design component 470, which may in association with the machine learning component 440 and the generation component 450, may learn and define the one or more design macros for automatically generating the one or more GRV design layouts.

The testing and evaluation component 4460, which may in association with the machine learning component 440, may selectively apply the one or more ground rules to test the one or more GRV design layouts and the testing includes electrical testing of the one or more GRV design layouts based on the one or more design macros.

That is, the testing and evaluation component 460, which may in association with the machine learning component 440, may incrementally increase, decrease, adjust, alter, and/or apply one or more GRV ranges to intentionally violate or break one or more ground rules to one or more GRV design layouts. The testing results may be collected and analyzed. In an additional aspect, the testing and evaluation component 460, which may in association with the machine learning component 440, may simultaneously sequentially apply one or more GRV ranges to a single ground rules or simultaneously sequentially apply one or more GRV ranges to multiple ground rules in relation to the target ground rules for comparison and evaluation. The testing and evaluation component 460, which may in association with the machine learning component 440, may learn, predict, and/or forecast testing results for future or subsequent testing operations of GRV ranges and ground rules for testing future GRV design layout based design macros.

The approval component 490, which may in association with the machine learning component 440, may provide results of testing the GRV design layout based on the one or more design macros.

The approval component 490, which may in association with the machine learning component 440, may correct or waive one or more ground rules based upon the degree of violation acceptability for approving the one or more GRV design layouts for manufacturing.

In one aspect, the machine learning component 440 as described herein, may perform various machine learning operations using a wide variety of methods or combinations of methods, such as supervised learning, unsupervised learning, temporal difference learning, reinforcement learning and so forth. Some non-limiting examples of supervised learning which may be used with the present technology include AODE (averaged one-dependence estimators), artificial neural network, backpropagation, Bayesian statistics, naive bays classifier, Bayesian network, Bayesian knowledge base, case-based reasoning, decision trees, inductive logic programming, Gaussian process regression, gene expression programming, group method of data handling (GMDH), learning automata, learning vector quantization, minimum message length (decision trees, decision graphs, etc.), lazy learning, instance-based learning, nearest neighbor algorithm, analogical modeling, probably approximately correct (PAC) learning, ripple down rules, a knowledge acquisition methodology, symbolic machine learning algorithms, sub symbolic machine learning algorithms, support vector machines, random forests, ensembles of classifiers, bootstrap aggregating (bagging), boosting (meta-algorithm), ordinal classification, regression analysis, information fuzzy networks (IFN), statistical classification, linear classifiers, fisher's linear discriminant, logistic regression, perceptron, support vector machines, quadratic classifiers, k-nearest neighbor, hidden Markov models and boosting. Some non-limiting examples of unsupervised learning which may be used with the present technology include artificial neural network, data clustering, expectation-maximization, self-organizing map, radial basis function network, vector quantization, generative topographic map, information bottleneck method, IBSEAD (distributed autonomous entity systems based interaction), association rule learning, apriori algorithm, eclat algorithm, FP-growth algorithm, hierarchical clustering, single-linkage clustering, conceptual clustering, partitional clustering, k-means algorithm, fuzzy clustering, and reinforcement learning. Some non-limiting example of temporal difference learning may include Q-learning and learning automata. Specific details regarding any of the examples of supervised, unsupervised, temporal difference or other machine learning described in this paragraph are known and are within the scope of this disclosure. Also, when deploying one or more machine learning models, a computing device may be first tested in a controlled environment before being deployed in a public setting. Also even when deployed in a public environment (e.g., external to the controlled, testing environment), the computing devices may be monitored for compliance.

Figure 5:
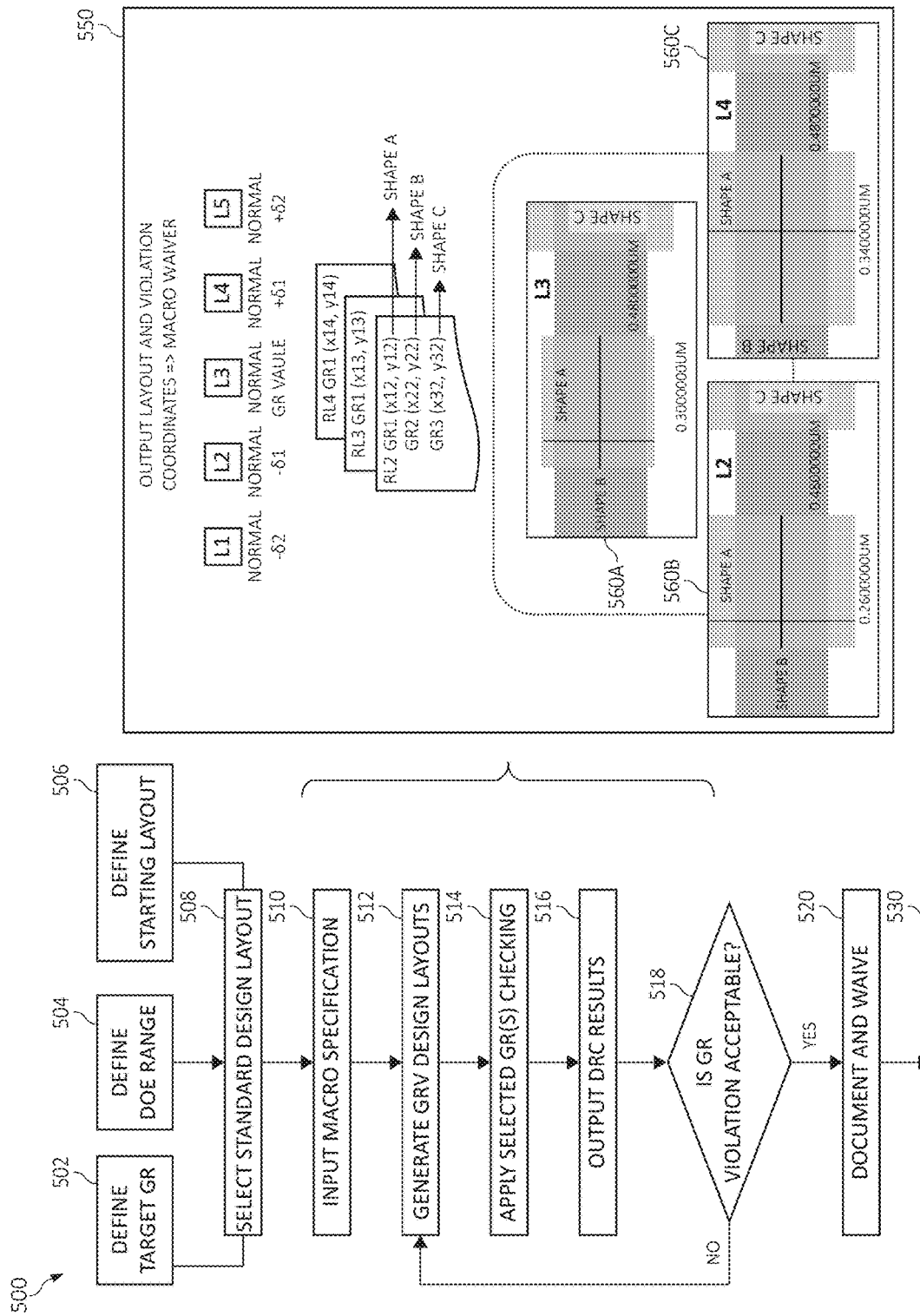
FIG. 5 depicts block flow diagram depicting operations for automatic generation of ground rule verification macros in a computing environment according to an embodiment of the present invention.

Turning now to FIG. 5, a block diagram depicts exemplary operations for automatic generation of ground rule verification macros. In one aspect, one or more of the components, modules, services, applications, and/or functions described in FIGS. 1-4 may be used in FIG. 5. As shown, various blocks of functionality are depicted with arrows designating the blocks' of system 500 relationships with each other and to show process flow (e.g., steps or operations). Additionally, descriptive information is also seen relating each of the functional blocks' of system 500.

As will be seen, many of the functional blocks may also be considered "modules" of functionality, in the same descriptive sense as has been previously described in FIGS. 1-4. Repetitive description of like elements employed in other embodiments described herein is omitted for sake of brevity.

With the foregoing in mind, the module blocks' of system 500 may also be incorporated into various hardware and software components of a system for automatic generation of ground rule verification macros in a computing environment in accordance with the present invention. Many of the functional blocks of system 500 may execute as background processes on various components, either in distributed computing components, or elsewhere.

Starting in blocks 502, 504, and 506, a target ground rule ("GR"), a design of experiment ("DOE") range, and an initial/staring design layout may each be defined (and/or learned). In block 508, a design layout (e.g., standard design layout) may be selected. The design layout may have one or more layouts.

One or more design macro specifications ("macro specs") may be inputted (e.g., learned, defined, received and/or inputted), as in block 510.

Ground rule verification ("GRV") design layout(s) may be generated, which may be based on a common or "standard" design layout, which may be based on the defined/learned target Gr, and the DOE range, and the initial/starting design layout, as in block 512.

A ground rule checking operation (e.g., "design rule checking" or DRC) may be applied to the selected GR's, as in block 514. The DRC checking results may be gathered, analyzed, and provided. In one aspect, the DRC operation may automatically select one or more ground rules to apply.

An operation may be performed to determine if the GR violations (if the results indicated a GR violation) are at least an acceptable violation level (e.g., a degree of acceptable violation), as in block 518. The acceptable violation level may be defined, learned, or based on test results with the test results within a range of acceptability (which may be on a variety of factors including, but not limited, the semiconductor material, design manufacturer, and/or design layout rules, and/or previously accepted range of acceptability.

If yes at block 518, and the GR violation is acceptable (e.g., within an acceptable range of ground rule violation window), the design layout and errors may be documented, approve, and waived (e.g., waive the violation for approval), as in block 520. From block 520, the design layout may be submitted to a database (e.g., a gatekeeper), as in block 530.

If no at block 518, and the GR violation is unacceptable (e.g., not within an acceptable range of ground rule violation window), the operations 500 may return to block 512.

The documented and approved deign layout and package may be approved such as, for example, by a machine learning operation and/or gatekeeper (e.g., a machine learning operation) may be corrected, fixed, updated, and/or approved (e.g., submit to a gatekeep such as, for example, administrator and/or machine learning operation), as in block 530.

As depicted in FIG. 5, block 550 depicts the collective operations of blocks 510-518 illustrating the output design layouts such (having various shapes such as, for example, shapes A, shape B, and shape C) and violations with various coordinates depicting macro waivers. More specifically, the standardized design layout L3 is depicted in box 560A, design macro layout L2 is box 560B, and design macro layout L3 is illustrated as box 560C.

In operation, for example, assume the standardized design layout (e.g., design layout L3) is provided (see block 508) and may have various layers and/or sections, which may be analyzed (e.g., analyzed using a machine learning operation).

Then, one or more design macro specifications (see block 510) may be received indicating various design macro layouts (e.g., design layouts L1, L2, L4, and L5) for testing the limits of the standardized design layout. By way of illustration only, design layout L3 reflects the standard design layout (from block 508) having target ground rules GR1, GR2, GR3, for example, with ground rule values ("GRV") or parameters (range/parameters "x13, y13", "x23, y23", "x33, y33"). That is, the target ground rule may be included in the standardized design layout (e.g., design layout L3) and may indicate that the design shape(s) may only have certain design parameters such as, for example, a varieties of shapes/sizes (based on the standard design layout), which are reflected as a ground rule "GR" value ("GRV") (e.g., normal GR value for design layout L3).

Using the design macro specifications (for L2 and L4), other design macro layers may be tested having different ground rules such as, for example, ground rule 1 ("GR1") having GRVs/parameters (range/parameters "x12, y12", or "x14, y14",) for macro design layer A in design macro L2 or L4, respectively; and ground rule 2 ("GR2") having GRV (range/parameters "x22, y22", "x24, y24") for macro design layer B in design macro L2 or L4, respectively.

In each design layer, by way of example only for illustrative purposes, including the standardized design layout L3, each of these ground rules and parameters/ranges may be used to produce and text shape A, shape B, and/or shape C. The deltas ("6") are the variances (in relation to the target range/values) to each of various design rule ranges/values (e.g., x11, y11 for shape A in L1, x21, y21 for shape B in L1, and x34, y34 for shape C in L4) that are received from the design macro specification such as, for example, delta values for design layout L1, design layout L2, design layout L4, and design layout L5.

As depicted in block 550, design layout L2 reflects the application of alternative ground rules GR1 with GRV (x12, y12). For example, ground rules GR1 with GRV (x12, y12) may indicated to reduce the height of shape A.

Alternatively, design layout L4 reflects the application of alternative ground rules GR1 with GRV (x14, y14). For example, ground rules GR1 with GRV (x14, y14) may indicated to increase the height of shape A.

Thus, as applied, each GRV macro design layout (e.g., L2 and L4) may be tested using one or more ground rules based similar or different GRV ranges (e.g., x12, y12 for L2 and x14, y14 for L4) for violating the target ground rule (e.g., GR1) that includes a target GRV (e.g., values/parameters x13, y13 for macro design layout L3).

By way of example only, boxes 560A-C depicts the testing results of operations of blocks 510-518, using the target ground rules as the standard and then violating the target ground rules by automatically applying other ground rules. Since each of these ground rules have different ground rule ranges (e.g., values and/or parameters), different macro design layouts may be changed, altered, or redesigned to test the outcome results. The testing may include electrical testing of each of the GRV design layouts (e.g., design layout L2, L3, and L4 as illustrated in block 550) based each design layout macros. Then, the non-target ground rules may be automatically selected and approved based upon a degree of violation acceptability. That is, if the testing results of each macro design layer indicate that the design layouts may be altered using the non-target ground rule with the different ground rule values/parameters based on the testing results falling within the degree of violation acceptability (e.g., ranges, values, number, or percentage), the non-target ground rule may be approved, accepted, or pre-waived.

Figure 6:
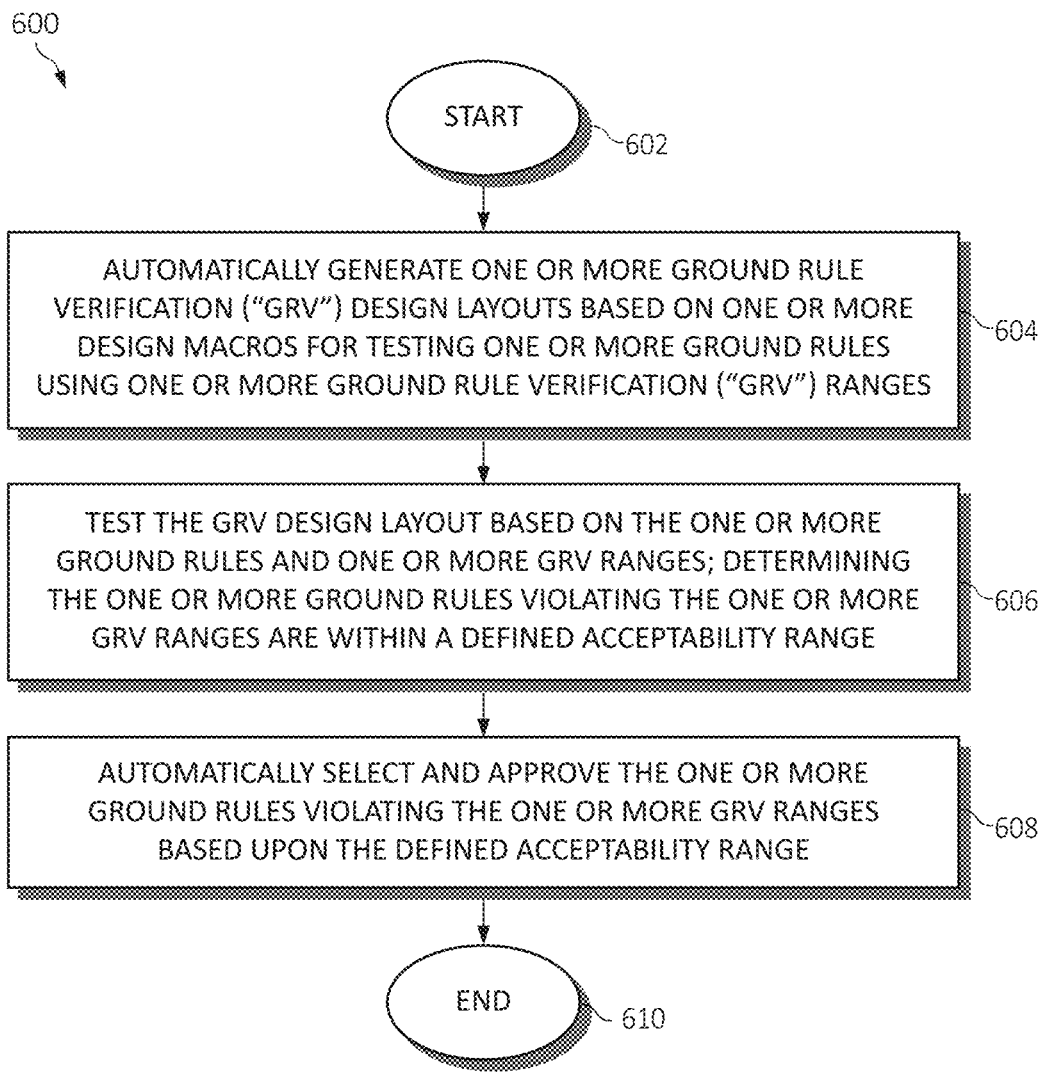
FIG. 6 is an additional flowchart diagram depicting an additional exemplary method for automatic generation of ground rule verification macros in a computing environment, by a processor, in which aspects of the present invention may be realized.

Turning now to FIG. 6, a method 600 for automatic generation of ground rule verification macros (e.g., design macros) of an integrated circuit in a computing environment using a processor is depicted, in which various aspects of the illustrated embodiments may be implemented. The functionality 600 may be implemented as a method (e.g., a computer-implemented method) executed as instructions on a machine, where the instructions are included on at least one computer readable medium or one non-transitory machine-readable storage medium. The functionality 600 may start in block 602.

GVR design layouts may be automatically generated based on one or more design macros, as in block 604. The GRV design layout may be tested based on the one or more design macros by violating one or more ground rules using one or more GRV ranges. The testing may include electrical testing of the one or more GRV design layouts based on the one or more design macros, as in block 606. The one or more ground rules may be automatically selected and approved the based upon a degree of violation acceptability, as in block 608. The functionality 600 may end, as in block 610.

In one aspect, in conjunction with and/or as part of at least one blocks of FIG. 6, the operations of method 600 may include each of the following. The operations of 600 may determine the one or more ground rules being violated are within the degree of violation acceptability.

The operations of 600 may define one or more target ground rules, define the one or more GRV ranges according to one or more selected parameters, and select an initial design layout of the integrated circuit based on the one or more target ground rules and the one or more GRV ranges.

The operations of 600 may learn and define the one or more design macros for automatically generating the one or more GRV design layouts.

The operations of 600 may selectively apply the one or more ground rules to test the one or more GRV design layouts, wherein the testing includes electrical testing of the one or more GRV design layouts based on the one or more design macros.

The operations of 600 may analyze and provide results of testing the GRV design layout based on the one or more design macros and correct or waive the one or more ground rules based upon the degree of violation acceptability for approving the one or more GRV design layouts for manufacturing.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The descriptions of the embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for automatic generation of ground rule verification macros in a computing environment by one or more processors comprising:
   receiving an initial, standardized design layout subject to one or more target ground rules bound by one or more parameters;
   automatically generating one or more ground rule verification ("GRV") design layouts based on one or more design macros, wherein the one or more GRV design layouts are each a modified version of the initial, standardized design layout;
   testing the one or more GRV design layouts based on the one or more design macros by incrementally and automatically adjusting one or more GRV ranges being modified from the one or more parameters of the initial, standardized design layout to intentionally cause one or more ground rules associated with the one or more GRV ranges of the one or more GRV design layouts to be violated; and
   automatically selecting and approving the one or more ground rules based upon a degree of violation acceptability from the one or more target ground rules identified during the testing.

2. The method of claim 1, further including determining the one or more ground rules being violated are within the degree of violation acceptability.

3. The method of claim 1, further including:
   defining the one or more target ground rules;
   defining the one or more GRV ranges according to one or more selected parameters; and
   selecting the initial, standardized design layout based on the one or more target ground rules and the one or more GRV ranges.

4. The method of claim 1, further including learning and defining the one or more design macros for automatically generating the one or more GRV design layouts.

5. The method of claim 1, further including selectively applying the one or more ground rules to test the one or more GRV design layouts, wherein the testing includes electrical testing of the one or more GRV design layout based on the one or more design macros.

6. The method of claim 1, further including providing results of testing the GRV design layout based on the one or more design macros.

7. The method of claim 1, further including correcting or waiving the one or more ground rules based upon the degree of violation acceptability for approving the one or more GRV design layouts for manufacturing.

8. A system for automatic generation of ground rule verification macros in a computing environment, comprising:
   one or more computers with executable instructions that when executed cause the system to:
   receive an initial, standardized design layout subject to one or more target ground rules bound by one or more parameters;
   automatically generate one or more ground rule verification ("GRV") design layouts based on one or more design macros, wherein the one or more GRV design layouts are each a modified version of the initial, standardized design layout;
   test the GRV design layouts based on the one or more design macros by incrementally and automatically adjusting one or more GRV ranges being modified from the one or more parameters of the initial, standardized design layout to intentionally cause one or more ground rules associated with the one or more GRV ranges of the one or more GRV design layouts to be violated; and
   automatically select and approve the one or more ground rules based upon a degree of violation acceptability from the one or more target ground rules identified during the testing.

9. The system of claim 8, wherein the executable instructions when executed cause the system to determine the one or more ground rules being violated are within the degree of violation acceptability.

10. The system of claim 8, wherein the executable instructions when executed cause the system to:
    define the one or more target ground rules;
    define the one or more GRV ranges according to one or more selected parameters; and
    select the initial, standardized design layout based on the one or more target ground rules and the one or more GRV ranges.

11. The system of claim 8, wherein the executable instructions when executed cause the system to learn and define the one or more design macros for automatically generating the one or more GRV design layouts.

12. The system of claim 8, wherein the executable instructions when executed cause the system to selectively apply the one or more ground rules to test the one or more GRV design layouts, wherein the testing includes electrical testing of the one or more GRV design layouts based on the one or more design macros.

13. The system of claim 8, wherein the executable instructions when executed cause the system to provide results of testing the GRV design layout based on the one or more design macros.

14. The system of claim 8, wherein the executable instructions when executed cause the system to correct or waive the one or more ground rules based upon the degree of violation acceptability for approving the one or more GRV design layouts for manufacturing.

15. A computer program product for automatic generation of ground rule verification macros in a computing environment, the computer program product comprising:
    one or more computer readable storage media, and program instructions collectively stored on the one or more computer readable storage media, the program instruction comprising:
    program instructions to receive an initial, standardized design layout subject to one or more target ground rules bound by one or more parameters;
    program instructions to automatically generate one or more ground rule verification ("GRV") design layouts based on one or more design macros, wherein the one or more GRV design layouts are each a modified version of the initial, standardized design layout;
    program instructions to test the GRV design layouts based on the one or more design macros by incrementally and automatically adjusting one or more GRV ranges being modified from the one or more parameters of the initial, standardized design layout to intentionally cause one or more ground rules associated with the one or more GRV ranges of the one or more GRV design layouts to be violated; and
    program instructions to automatically select and approve the one or more ground rules based upon a degree of violation acceptability from the one or more target ground rules identified during the testing.

16. The computer program product of claim 15, further including program instructions to determine the one or more ground rules being violated are within the degree of violation acceptability.

17. The computer program product of claim 15, further including program instructions to:
- define the one or more target ground rules;
- define the one or more GRV ranges according to one or more selected parameters; and
- select the initial, standardized design layout circuit based on the one or more target ground rules and the one or more GRV ranges.

18. The computer program product of claim 15, further including program instructions to learn and define the one or more design macros for automatically generating the one or more GRV design layouts.

19. The computer program product of claim 15, further including program instructions to selectively apply the one or more ground rules to test the one or more GRV design layouts, wherein the testing includes electrical testing of the one or more GRV design layouts based on the one or more design macros.

20. The computer program product of claim 15, further including program instructions to:
- provide results of testing the GRV design layout based on the one or more design macros; and
- correct or waive the one or more ground rules based upon the degree of violation acceptability for approving the one or more GRV design layouts for manufacturing.

\* \* \* \* \*